United States Patent
Huang et al.

(10) Patent No.: US 11,832,435 B2
(45) Date of Patent: Nov. 28, 2023

(54) SEMICONDUCTOR DEVICE AND METHOD OF FABRICATING THE SAME

(71) Applicant: NANYA TECHNOLOGY CORPORATION, New Taipei (TW)

(72) Inventors: Chih-Wei Huang, Taoyuan (TW); Hsu-Cheng Fan, Taoyuan (TW); En-Jui Li, New Taipei (TW); Chih-Yu Yen, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 86 days.

(21) Appl. No.: 17/455,668

(22) Filed: Nov. 18, 2021

(65) Prior Publication Data

US 2023/0157001 A1 May 18, 2023

(51) Int. Cl.
| | |
|---|---|
| *H01L 29/94* | (2006.01) |
| *H01L 29/76* | (2006.01) |
| *H10B 12/00* | (2023.01) |
| *H01L 29/66* | (2006.01) |
| *H01L 29/06* | (2006.01) |

(52) U.S. Cl.
CPC ......... *H10B 12/30* (2023.02); *H01L 29/0649* (2013.01); *H01L 29/6656* (2013.01); *H10B 12/482* (2023.02)

(58) Field of Classification Search
CPC ... H10B 12/30; H10B 12/482; H01L 29/0649; H01L 29/6656
USPC .......................................................... 257/295
See application file for complete search history.

(56) References Cited

U.S. PATENT DOCUMENTS

| | | | |
|---|---|---|---|
| 2017/0271340 A1* | 9/2017 | Kim | .............. H10B 12/0335 |
| 2021/0210493 A1* | 7/2021 | Kim | .................. H01L 21/764 |

FOREIGN PATENT DOCUMENTS

CN 109841595 A 6/2019

* cited by examiner

*Primary Examiner* — Theresa T Doan
(74) *Attorney, Agent, or Firm* — CKC & Partners Co., LLC

(57) ABSTRACT

A method of fabricating the semiconductor device includes forming a bit line structure over a substrate, forming a spacer structure on a sidewall of the bit line structure, partially removing an upper portion of the spacer structure to form a slope on the spacer structure slanting to the bit line structure, forming a landing pad material to cover the spacer structure and contact the slope, and removing at least a portion of the landing pad material to form a landing pad against the slope.

7 Claims, 13 Drawing Sheets

SEMICONDUCTOR DEVICE AND METHOD OF FABRICATING THE SAME

BACKGROUND

Field of Invention

The present disclosure relates to a semiconductor device and a method for fabricating the same.

Description of Related Art

Smaller and lighter electronics devices have driven semiconductor devices shirked with a high degree of integration. The highly compact semiconductor devices result in limited space for element configuration. For example, a landing pad is configured in a conventional dynamic random access memory (DRAM) cells for a purpose of electrical interconnection. As the DRAM cells become smaller, a reduced landing area for the landing pad may increase the resistance and decrease the current, thereby influencing performance of the DRAM cells.

SUMMARY

An aspect of the present disclosure provides a method of fabricating the semiconductor device. The method of fabricating the semiconductor device includes forming a bit line structure over a substrate, forming a spacer structure on a sidewall of the bit line structure, partially removing an upper portion of the spacer structure to form a slope on the spacer structure slanting to the bit line structure, forming a landing pad material to cover the spacer structure and contact the slope, and removing at least a portion of the landing pad material to form a landing pad against the slope.

An aspect of the present disclosure provides a semiconductor device. The semiconductor device includes a substrate, a bit line structure formed over and protruding from the substrate, and a spacer structure formed on and extending along sidewall of the bit line structure. The spacer structure includes a first segment near a top of the spacer structure with a slope and a second segment beneath the first segment. The second segment comprises a 3-layer structure and is capped with the first segment. The semiconductor device further includes a landing pad disposed on the bit line structure and covering the slope.

An aspect of the present disclosure provides a semiconductor device and a method of fabricating the same. A spacer structure with a slope slanting to a bit line structure can help a landing pad to have an enlarged landing area, thereby decreasing resistance of the landing pad.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows:

FIG. 2 to FIG. 10A are cross-sectional views illustrating different steps of a method of fabricating a semiconductor device according to some embodiments of the present disclosure.

DETAILED DESCRIPTION

Figure 1:
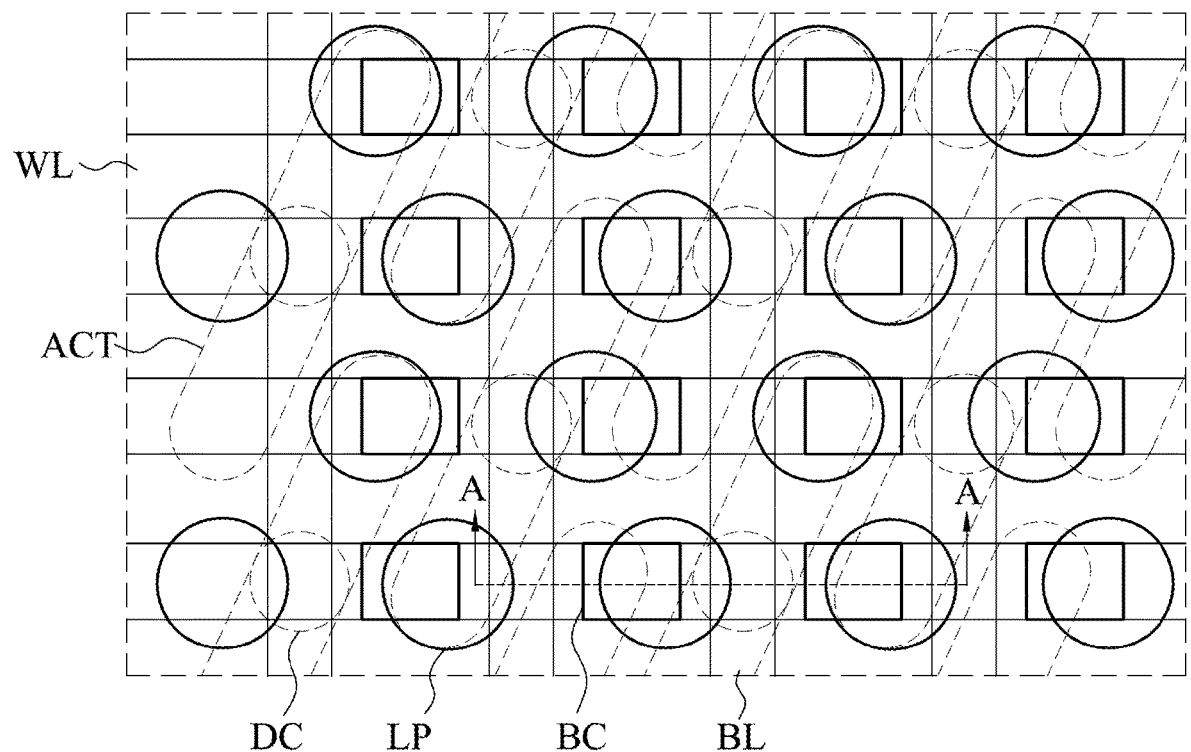
FIG. 1 is an arrangement diagram of a semiconductor device according to some embodiments of the present disclosure.
Figure 1:
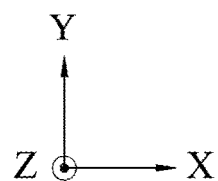

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

It will be understood that when an element is referred to as being "on" another element, it can be directly on the other element or intervening elements may be presented therebetween. In contrast, when an element is referred to as being "directly on" another element, there are no intervening elements present. As used herein, the term "and/or" includes any and all combinations of one or more of the associated listed items. Reference will now be made in detail to the present embodiments of the disclosure, examples of which are illustrated in the accompanying drawings. Wherever possible, the same reference numbers are used in the drawings and the description to refer to the same or like parts.

Referring to FIG. 1, FIG. 1 is an arrangement diagram of a semiconductor device 100 according to some embodiments of the present disclosure. The semiconductor device 100 may include a plurality of active areas ACT. The active area ACT has a short axis and a long axis. In some embodiment, the long axis of the active area ACT may extend in a diagonal axis with respect to an X axis.

A plurality of word lines WL may be configured across the active areas ACT and extend along the X axis. The word line WL is in parallel to each other. Additionally, the word line WL may be spaced apart from each other at substantially equal intervals.

A plurality of bit lines BL may be arranged above the word lines WL and may extend along a Y axis. Similarly, the lines BL is in parallel to each other. In addition, the bit line BL can be connected to the active area ACT through a direct contact DC. One active area ACT may be electrically connected to one direct contact DC.

A plurality of buried contacts BC may be formed between two adjacent bit lines BL. In some embodiments, the buried contacts BC may be spaced apart from each other along the Y axis. The buried contact BC may electrically connect a lower electrode of the capacitor (not shown) to a corresponding active area ACT. One active area ACT may be electrically connected to two buried contacts BC.

A plurality of landing pads LP may be disposed above the buried contacts BC and overlap at least a portion of a corresponding bit line BL. The landing pad may electrically connect the buried contact BC. Also, the landing pad LP may also electrically connect the lower electrode of the capacitor (not shown) to a corresponding active area ACT. In another words, the lower electrode of the capacitor (not shown) may be electrically connected to a corresponding active area ACT through a corresponding buried contact BC and a corresponding landing pad LP.

In some embodiments, one buried contact BC and one landing pad LP may collectively be referred to as a contact plug, and may be respectively referred to as a first contact plug (BC) and a second contact plug (LP).

FIG. 2 to FIG. 10A, FIG. 11 and FIG. 12 are cross-sectional views illustrating different steps of a method of fabricating a semiconductor device (e.g., semiconductor device 100) in accordance with some embodiments of the present disclosure. The cross-section views of FIG. 2 to FIG. 10A, FIG. 11 and FIG. 12 are based on a reference cross-sectional view taken along line A-A shown in FIG. 1.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

Figure 2:
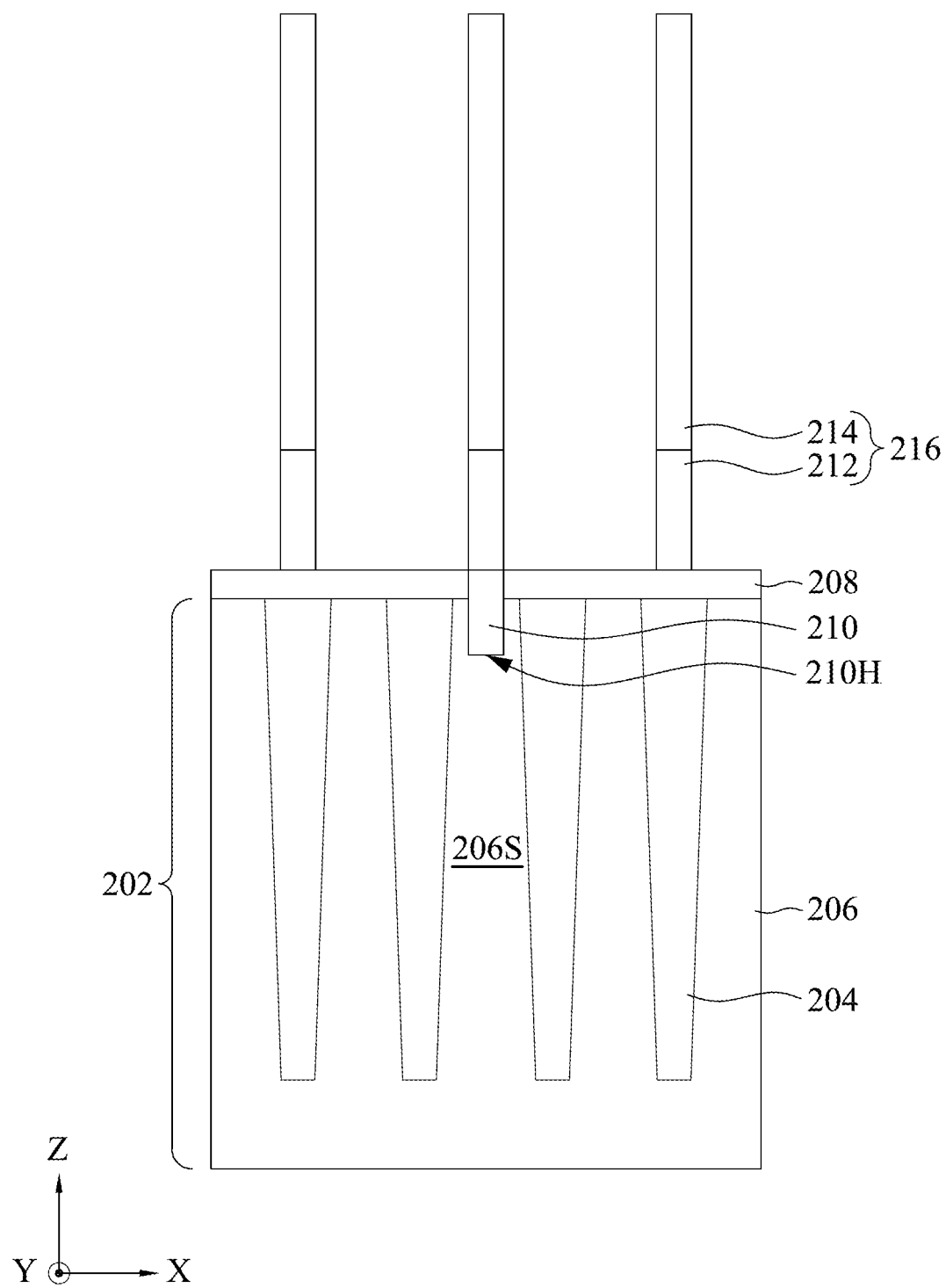

Referring to FIG. 2, a plurality of bit line structures 216 are formed over a substrate 202.

The substrate 202 includes a plurality of isolation areas 204 and a plurality of active areas 206. The active areas 206 are spaced apart by the isolation areas 204. The substrate 202 may include, for example, silicon (e.g., crystalline silicon, polycrystalline silicon, or amorphous silicon). In some embodiments, the substrate 202 may include other elementary semiconductor such as germanium. In some embodiments, the substrate 202 may include an alloy semiconductor such as silicon germanium, silicon germanium carbide, gallium indium phosphide and the like. In some embodiments, the substrate 202 may include compound semiconductor such as gallium arsenic, silicon carbide, indium phosphide, indium arsenide and the like. Further, the substrate 202 may optionally include a semiconductor-on-insulator (SOI) structure.

The isolation areas 204 may be formed through a shallow trench isolation (STI) process. The isolation areas 204 may include, for example, a material including at least one of silicon oxide, silicon nitride, and silicon oxynitride. The isolation areas 204 may be a single layer including one kind of insulator, a double layer including two kinds of insulators, or a multilayer including a combination of at least three kinds of insulators. For example, the isolation areas 204 may include silicon oxide and silicon nitride. For example, the isolation areas 204 may include a triple layer including silicon oxide, silicon nitride, and silicon oxynitride.

An insulation layer 208 with at least one opening 210H is formed on the substrate 202 and covers a top surface of the isolation areas 204 and the active areas 206 of the substrate 202.

The opening 210H may expose at least one active area among the active areas 206 of the substrate 202 during a process of forming the insulation layer 208. The opening 210H is then filled with a conductive material to form a direct contact 210. At least one active area which contacts the direct contact 210 may be referred to as a source area 206S. The direct contact 210 may be electrically connected to the source area 206S.

A plurality of bit line structures 216 protrudes from the substrate 202. In some embodiments, the bit line structures 216 may be regularly arranged at substantially equal intervals from each other over the substrate 202. The bit line structure 216 may further include two portions along a vertical direction substantially perpendicular to the substrate 202 (e.g., along Z direction): a first conductive layer 212 at lower portion, and an insulation capping layer 214 at upper portion.

The formation of the first conductive layer 212 and the insulation capping layer 214 may include forming a conductive material layer and an insulation capping material layer sequentially over the substrate 202. The insulation capping material layer may be formed on the first conductive material layer. In one embodiment, both of the first conductive material layer and the insulation capping material layer may be substantially simultaneously etched to form the first conductive layer 212 and the insulation capping layer 214. Thus, the bit line structure 216 including the first conductive layer 212 and the insulation capping layer 214 may be spaced apart from each other in a first direction (e.g., the X direction) and extend in parallel with each other along a second direction (e.g., the Y direction). In yet another embodiment, the insulation capping material layer is etched with desirable patterned and served as a mask pattern on the first conductive material layer. Using the patterned insulation capping material layer as an etch mask, the first conductive material layer is etched to form the first conductive layer 212.

In some embodiments, the first conductive layer 212 includes at least one material selected from semiconductor with impurities doped thereon, metal, conductive metal nitride, and metal silicide. In some embodiments, the first conductive layer 212 may have a stacked structure. For example, the first conductive layer 212 may be stacked with materials including doped polysilicon as well as metal nitride or metal such as tungsten, tungsten nitride, and/or titanium nitride. The first conductive layer 212 may be electrically connected to the direct contact 210.

In some embodiments, the insulation capping layer 214 includes silicon nitride. A vertical length (e.g., a length along the Z axis) of the insulation capping layer 214 may be greater than that of the first conductive layer 212.

Figure 3:
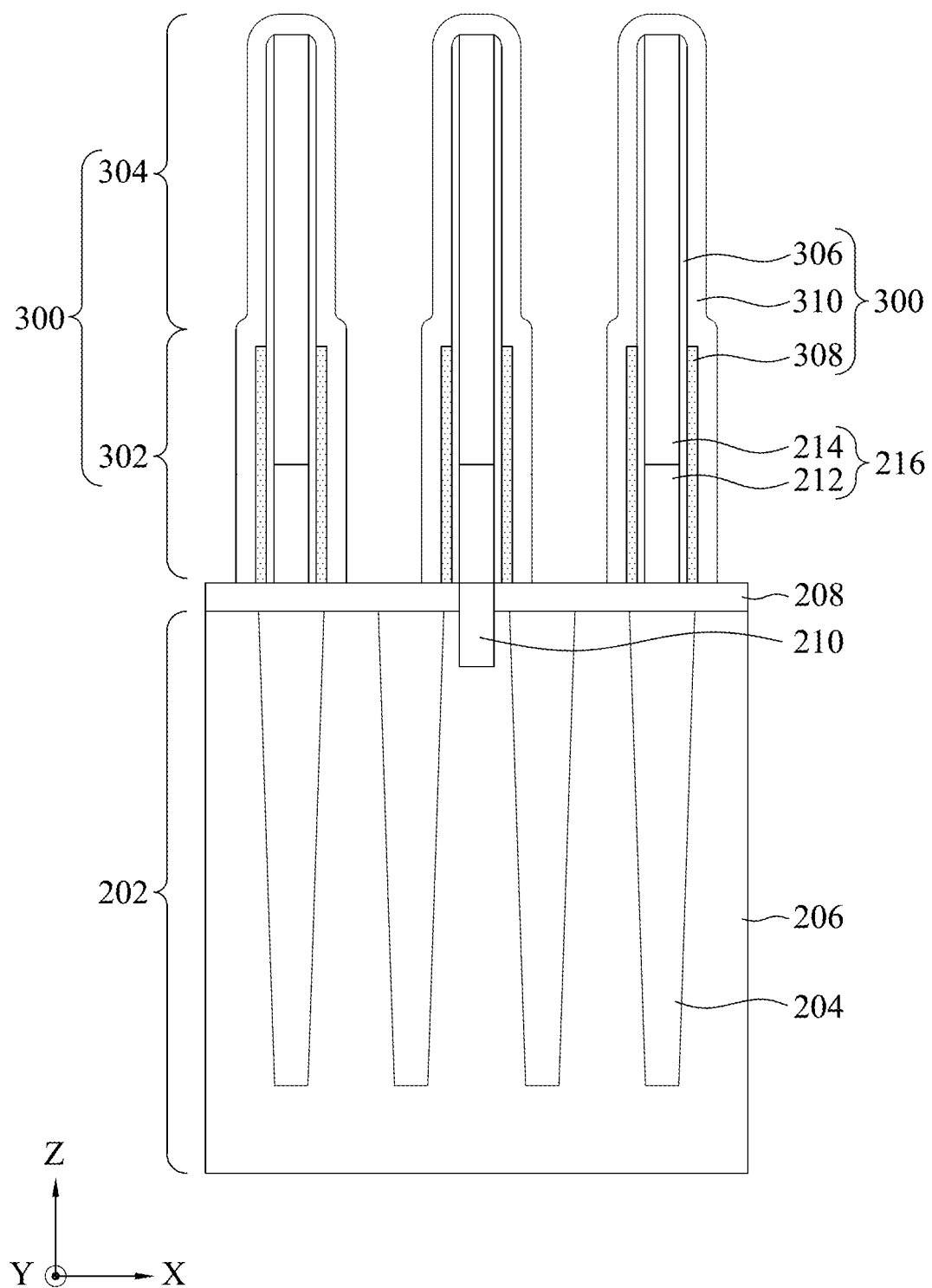

Referring to FIG. 3, a spacer structure 300 is formed on the bit line structure 216. Particularly, the spacer structure 300 extends along a sidewall of the bit line structure 216.

The spacer structure 300 may include a first spacer layer 306, a second spacer layer 308 and a third spacer layer 310 successively formed over the bit line structure 216. That is, the second spacer layer 308 is sandwiched between the first spacer layer 306 and the third spacer layer 310.

In some embodiments, the second spacer layer 308 can be used as a sacrificial layer for transforming into an air gap in subsequent fabrication stages. Consequently, the second spacer layer 308 may have an etch selectivity with respect to the first spacer layer 306 and/or the third spacer layer 310. In other words, during the same etching process, an etching rate on the second spacer layer 308 is faster than that on the first spacer layer 306 and/or that on the third spacer layer 310. In some embodiments, the first spacer layer 306 includes silicon nitride. In some embodiments, the third spacer layer 310 includes silicon nitride. In some embodiments, the second spacer layer 308 includes oxide. For example, the second spacer layer 308 may include a silicon oxide layer. Based on the disclosure herein, other materials, as discussed above, can be used, and these materials are within the spirit and scope of this disclosure.

The first spacer layer 306, the second spacer layer 308 and the third spacer layer 310 may be formed by any suitable deposition approaches such as chemical vapor deposition (CVD) techniques, atomic layer deposition (ALD), or physical vapor deposition (PVD) techniques. In some embodiment, any suitable etching approaches such as reactive ion etching (RIE) techniques may be implemented on the first spacer layer 306, the second spacer layer 308, and/or the third spacer layer 310 to form a particular configuration depending on a design of a semiconductor device. For example, the second spacer layer 308 may not be as high as the first spacer layer 306 and/or the third spacer layer 310.

In an embodiment where the second spacer layer 308 is served as a sacrificial layer, the second spacer layer 308 may be etched to reduce a height of the second spacer layer 308. As a result, a top surface of the second spacer layer 308 is positioned between a top surface of the first conductive layer 212 and a top surface of the insulation capping layer 214. The first spacer layer 306 and the third spacer layer 310 above the second spacer layer 308 can function as a protection for the second spacer layer 308 against damage in subsequent etching process (will be discussed later), thereby keeping the second spacer layer 308 and an air gap formed later intact. Meanwhile, the second spacer layer 308 adjacent to and above the first conductive layer 212 can still provide the first conductive layer 212 with a desirable insulation.

Therefore, in FIG. 3, the spacer structure 300 can be categorized into two portions along a vertical direction substantially perpendicular to the substrate 202 (e.g., along Z direction) with respect to the second spacer layer 308: a lower portion 302 and an upper portion 304. In detail, the lower portion 302 of the spacer structure 300 can be a 3-layer structure with the first spacer layer 306, the second spacer layer 308 and the third spacer layer 310. On the other hand, the upper portion 304 of the spacer structure 300 can be a 2-layer structure with the first spacer layer 306 and the third spacer layer 310 capping the lower portion 302.

Figure 4:
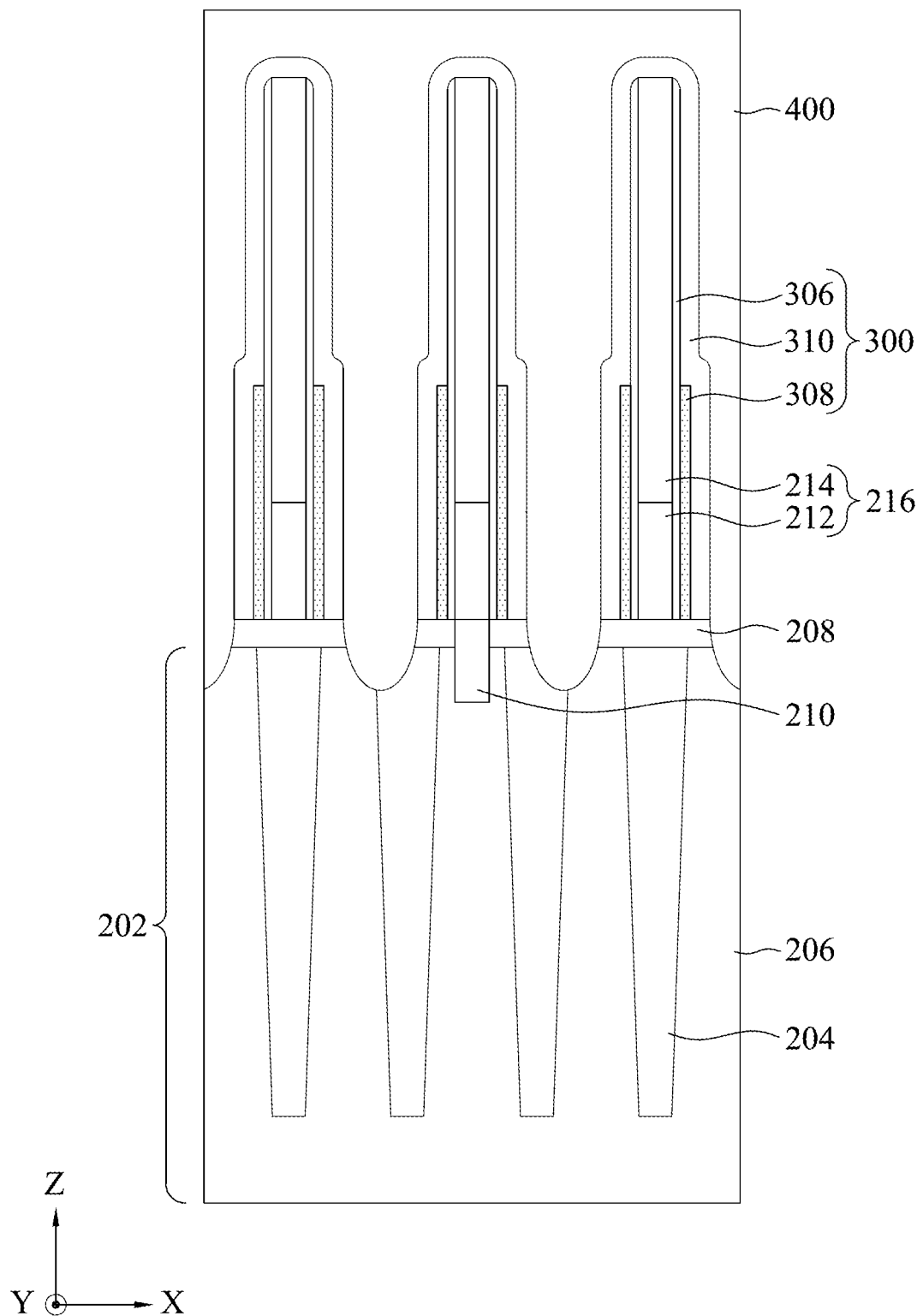

Referring to FIG. 4, a second conductive layer 400 is formed between and on the spacer structure 300 and the bit line structure 216. The sidewall of the spacer structure 300 can be covered by the second conductive layer 400. The second conductive layer 400 may protrude into the substrate 202 along the Z axis and directly contact the isolation areas 204 of the substrate 202 and active areas 206 of the substrate 202 since an etching process may be performed to expose a portion of isolation areas 204 of the substrate 202 and a portion of active areas 206 of the substrate 202. Then, a deposition process may be performed to gap-fill the exposed isolation areas 204 of the substrate 202 and active areas 206 of the substrate 202. In some embodiments, the second conductive layer 400 includes a silicon-containing material. For example, the second conductive layer 400 may include doped polysilicon.

Figure 5:
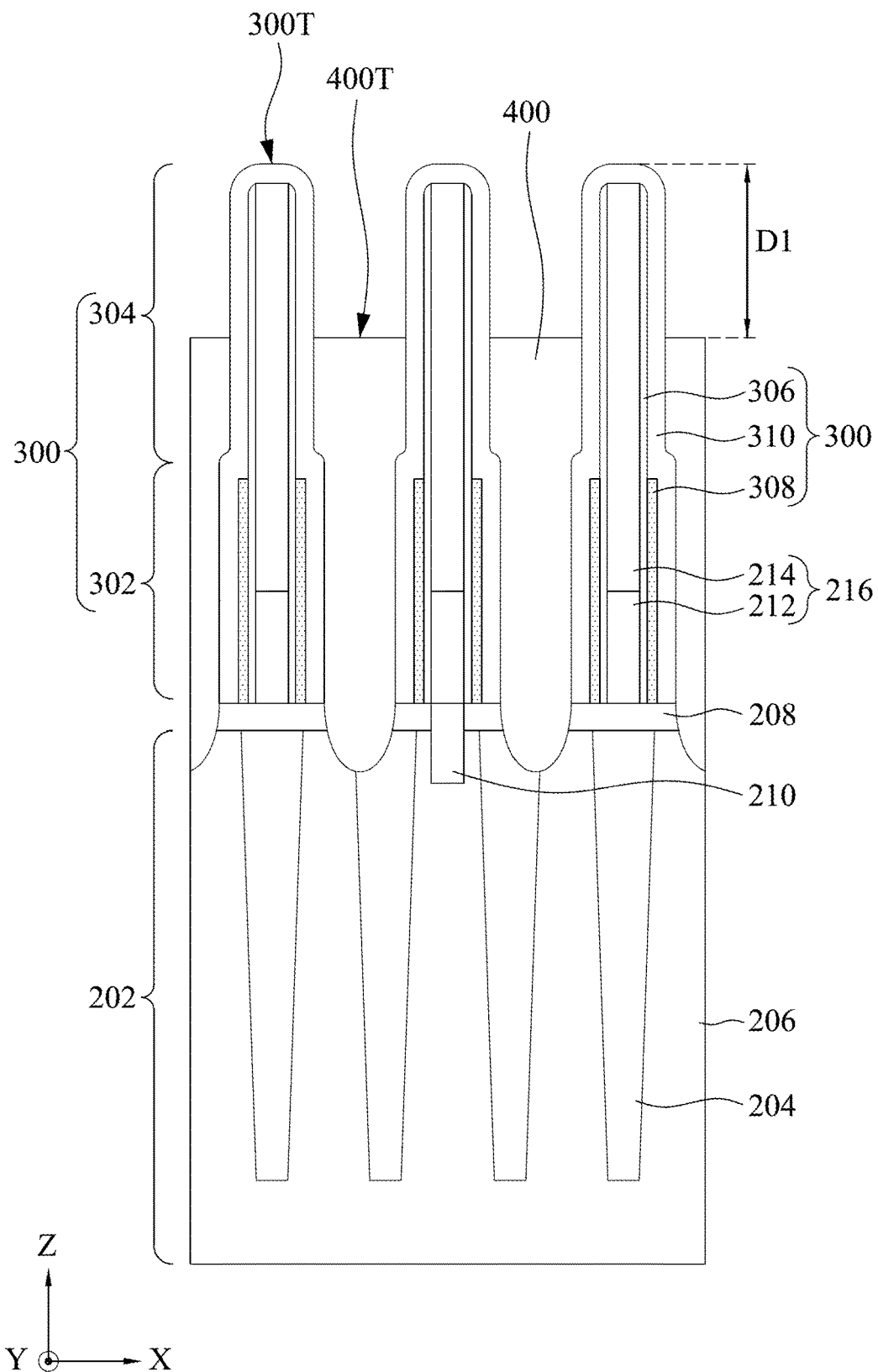

Referring to FIG. 5, a portion of the second conductive layer 400 is removed to expose the upper portion 304 of the spacer structure 300. In some embodiments, the second conductive layer 400 is etched back, so that the recessed second conductive layer 400 is formed between the bit line structures 216. The formation of the recessed second conductive layer 400 may include a selective etch process. That is, in the etch process applied on the second conductive layer 400, the spacer structure 300 are not etched because of an etch selectivity with respect to the second conductive layer 400. In some embodiments, a dry etch-back process is applied. For example, a RIE process is applied.

A top surface 400T of the recessed second conductive layer 400 has a level less than a top surface 300T of the spacer structure 300 by a first distance D1. Further, the top surface 400T of the recessed second conductive layer 400 may be controlled to a level greater than the lower portion 302 of the spacer structure 300 as a function of protection for the second spacer layer 308. The first distance D1 can be varied with a process design and product requirement. In some embodiments, the first distance D1 is in a range of about 10 nm to about 20 nm. If the first distance D1 is greater than the above-noted upper limits, the recessed second conductive layer 400 may not provide the spacer structure 300 with sufficient protection, thus increasing risk of damage on the second spacer layer 308 or an air gap formed later. If the first distance D1 is less than the above-noted lower limits, an intermediate structure with a rocket shape may not be formed with enough vertical length (e.g., along the Z axis), thus failing to enlarge a landing area in a landing pad (will be discussed later in FIG. 6).

Figure 6:
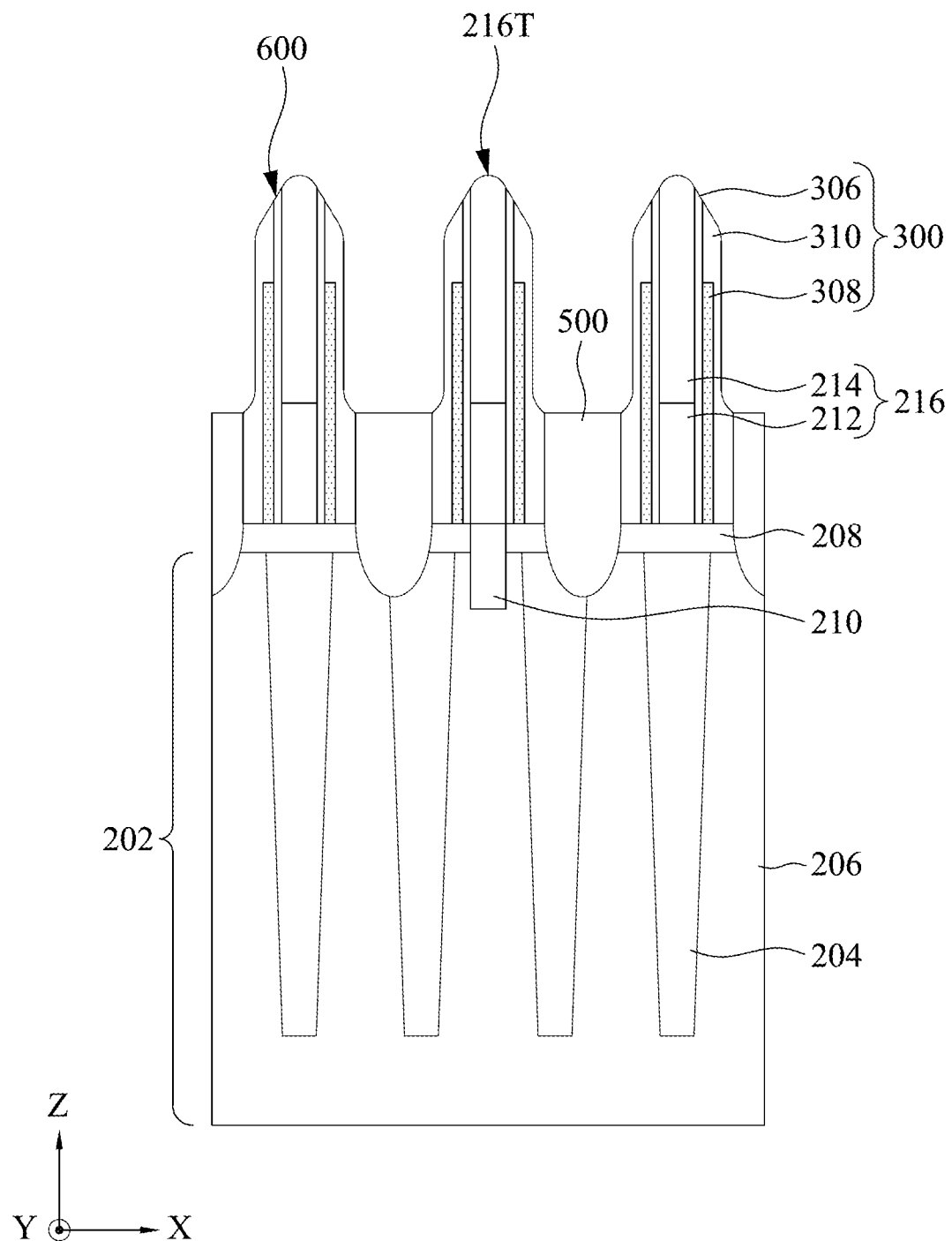

Referring to FIG. 6, the upper portion 304 (see FIG. 5) of the spacer structure 300 is partially removed to form a slope 600 on the spacer structure 300 slanting to the bit line structure 216 after the portion of the second conductive layer 400 is exposed by the operation in FIG. 5. During the partial removal process, a top surface 216T of the bit line structure 216 may be rounded and form a relatively rounded top surface 216T. In some embodiments, a connection between the slope 600 and the rounded top surface 216T of the bit line structure 216 may be continuous and smooth. After the removal process, a height of the spacer structure 300 and a height of the bit line structure 216 may be decreased. In some embodiments, the height of the bit line structure 216 may greater than the height of the spacer structure 300. Therefore, in a such embodiment, the slope 600 on the spacer structure 300 and the rounded top surface 216T of the bit line structure 216 may collectively forms an intermediate structure with a rocket shape, as shown in FIG. 6.

In addition, a height of the recessed second conductive layer 400 (see FIG. 5) may also be reduced and become a contact plug 500, regarded to be a buried contact. In some embodiments, the third spacer layer 310 without coverage of the contact plug 500 may be thinner during the partial removal process. As aforementioned protection provided by the second conductive layer 400 (see FIG. 5) to the spacer structure 300, a height of the contact plug 500 may be controlled to a level approximately same as or greater than the top of the first conductive layer 212 in order to protect the spacer structure 300 adjacent to the first conductive layer 212, thus ensuring a insulation between the contact plug 500 and the first conductive layer 212. It is noted that a profile of the intermediate structure shown in FIG. 6 is for a purpose of illustration only and the profile of the intermediate structure can be varied with a process design and product requirement.

In some embodiments, an etching process used to partially remove the upper portion 304 (see FIG. 5) of the spacer structure 300 includes using a dry etching on the spacer structure 300. The slope 600 on the spacer structure 300 can be manipulated by etchant flow, pressure, power and other suitable process parameters. In some embodiments, the spacer structure 300, the bit line structure 216, the contact plug 500 (i.e., the second conductive layer 400 in FIG. 5) may be etched in a same processing tool (e.g., in a same tool without breaking process atmosphere). For example, the type of etchant that is pumped into a processing chamber can be varied during the dry etching process. In some embodiments, by etching the spacer structure 300, the bit line structure 216, the contact plug 500 (i.e., the second conductive layer 400 in FIG. 5) in the same processing tool, a cost to fabricate the semiconductor device may be reduced.

Later, the landing pad material is formed with reference to FIG. 7, FIG. 8 and FIG. 9.

Figure 7:
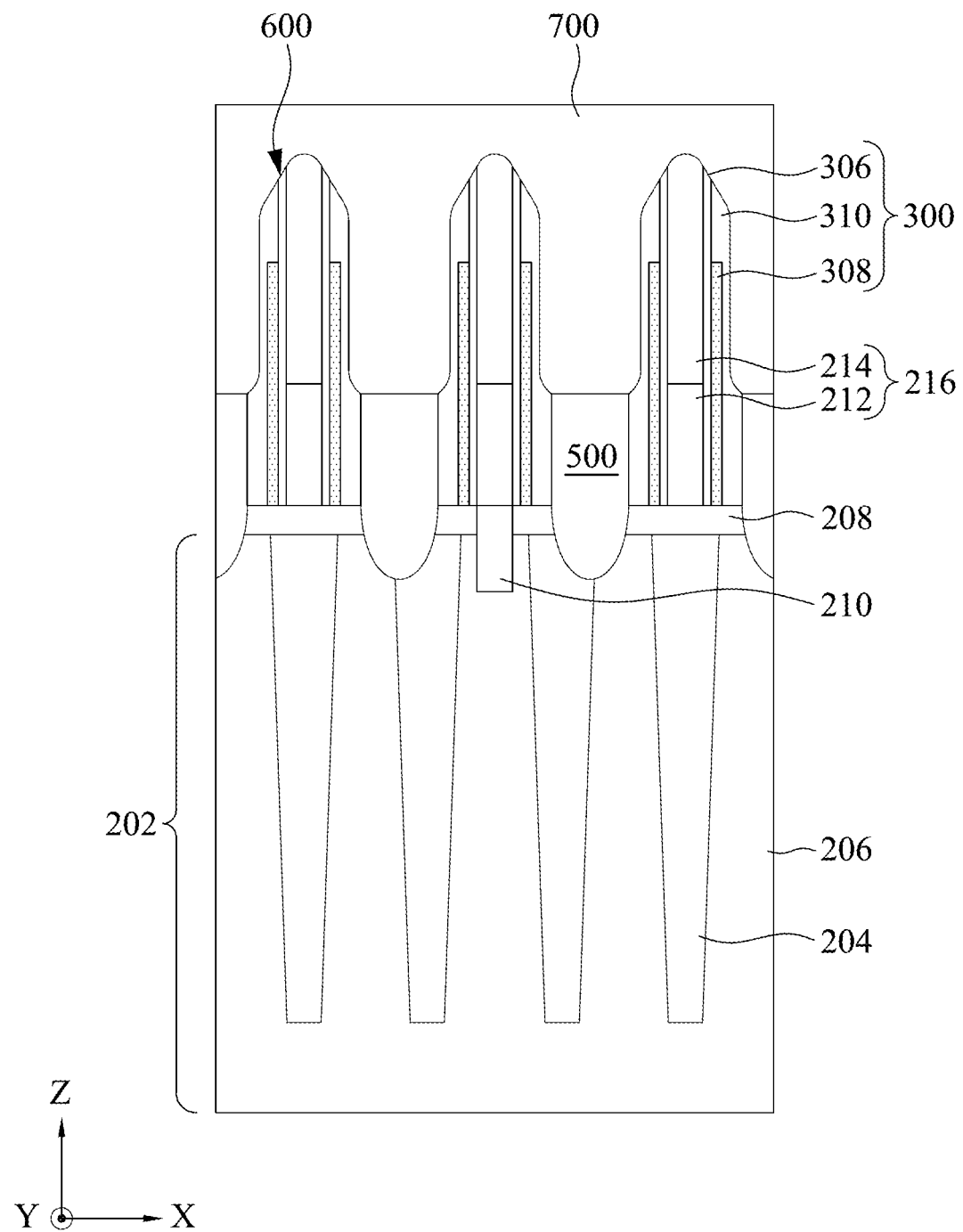
Figure 8:
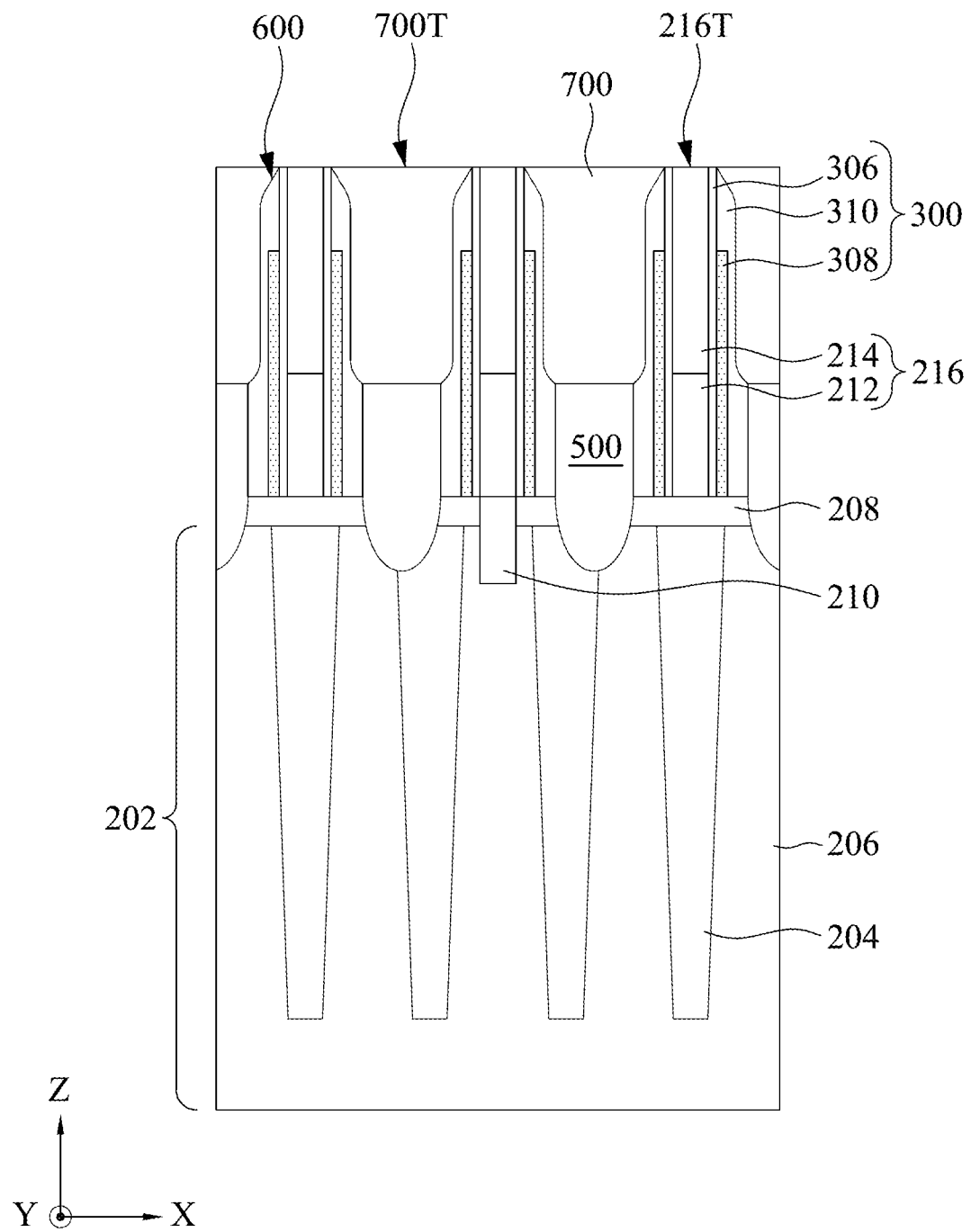

Referring to FIG. 7, a third conductive layer 700 is formed on the bit line structure 216, the spacer structure 300 and/or the contact plug 500. The third conductive layer 700 is disposed between two adjacent bit line structures 216. In some embodiments, the third conductive layer 700 covers the spacer structure 300 and directly contacts the slope 600.

The third conductive layer 700 is positioned above the contact plug 500 and is electrically connected to the contact plug 500.

The third conductive layer 700 may be stacked with materials including metal nitride or metal such as tungsten, tungsten nitride, and/or titanium nitride. The third conductive layer 700 can be deposited by using CVD, ALD, PVD, or other suitable deposition process. For example, the third conductive layer 700 can be deposited by using CVD for gap-fill between two adjacent bit line structures 216.

Subsequently, referring to FIG. 8, the third conductive layer 700 (see FIG. 7) is leveled. The bit line structure 216 can be leveled at the same time. The leveled third conductive layer 700 with a top surface 700T coplanar to the leveled top surface 216T of the bit line structure 216. In some embodiments, the first spacer layer 306 may be leveled as well. A chemical mechanical planarization (CMP) process can be used to form the leveled third conductive layer 700 and the leveled bit line structure 216. The CMP process may keep performing until a signal from one of materials included in the bit line structure 216 (such as nitrogen (N) signal) is detected. In some embodiments, the slope 600 can still be on the spacer structure 300 after the CMP process.

Figure 9:
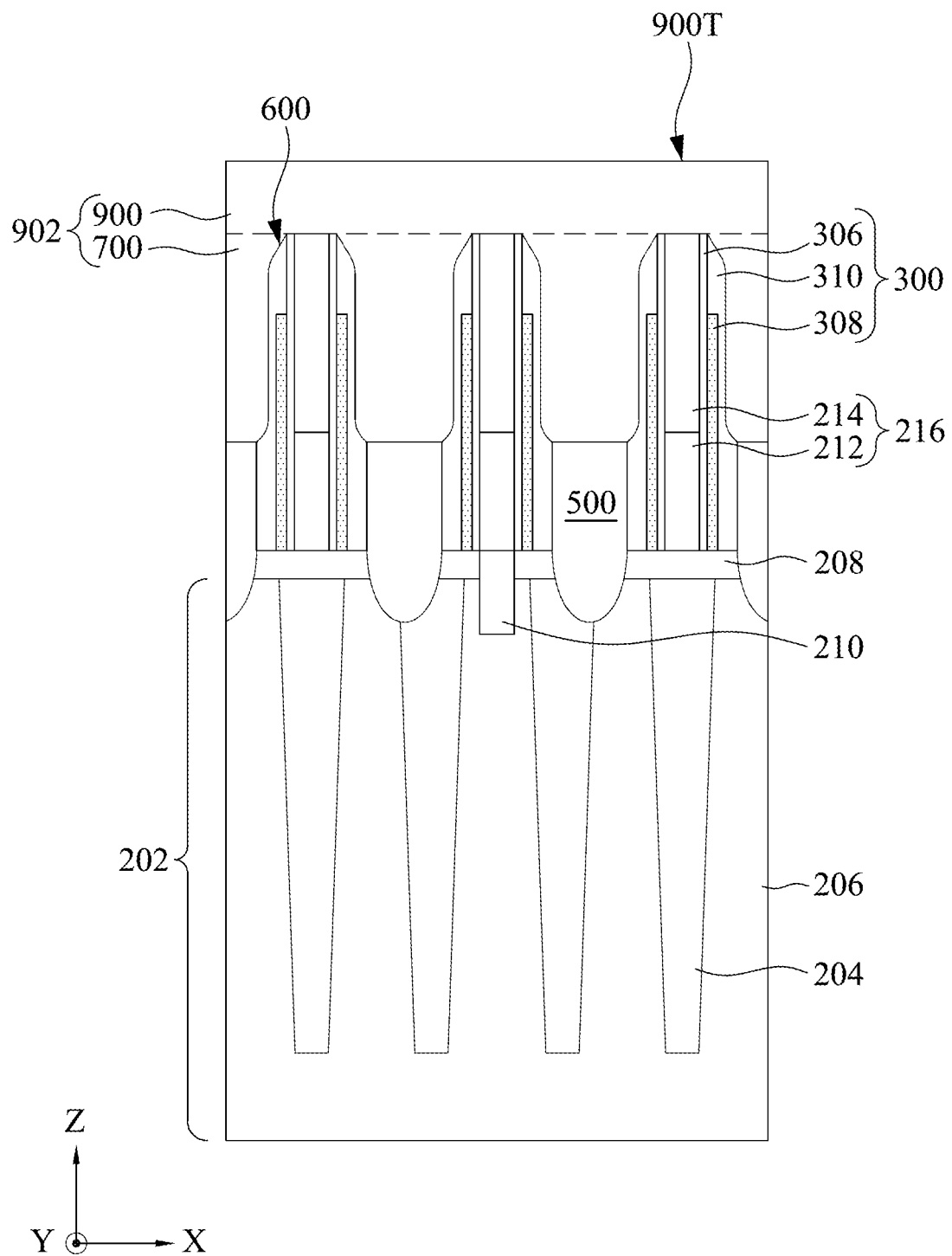

Next, referring to FIG. 9, a fourth conductive layer 900 is formed on the bit line structure 216 and the leveled third conductive layer 700. A top surface 900T of the fourth conductive layer 900 is higher than the bit line structure 216, covering the slope 600. The fourth conductive layer 900 directly contacts and electrically connects the third conductive layer 700. The third conductive layer 700 and the fourth conductive layer 900 can collectively regarded as a landing pad material 902. The landing pad material 902 can cover the spacer structure 300 and contact the slope 600.

Materials included in the fourth conductive layer 900 are substantially identical to materials included in the third conductive layer 700, and therefore no further descriptions are elaborated therein. The fourth conductive layer 900 can be deposited by using CVD, ALD, PVD, or other suitable deposition process.

Figure 10A:
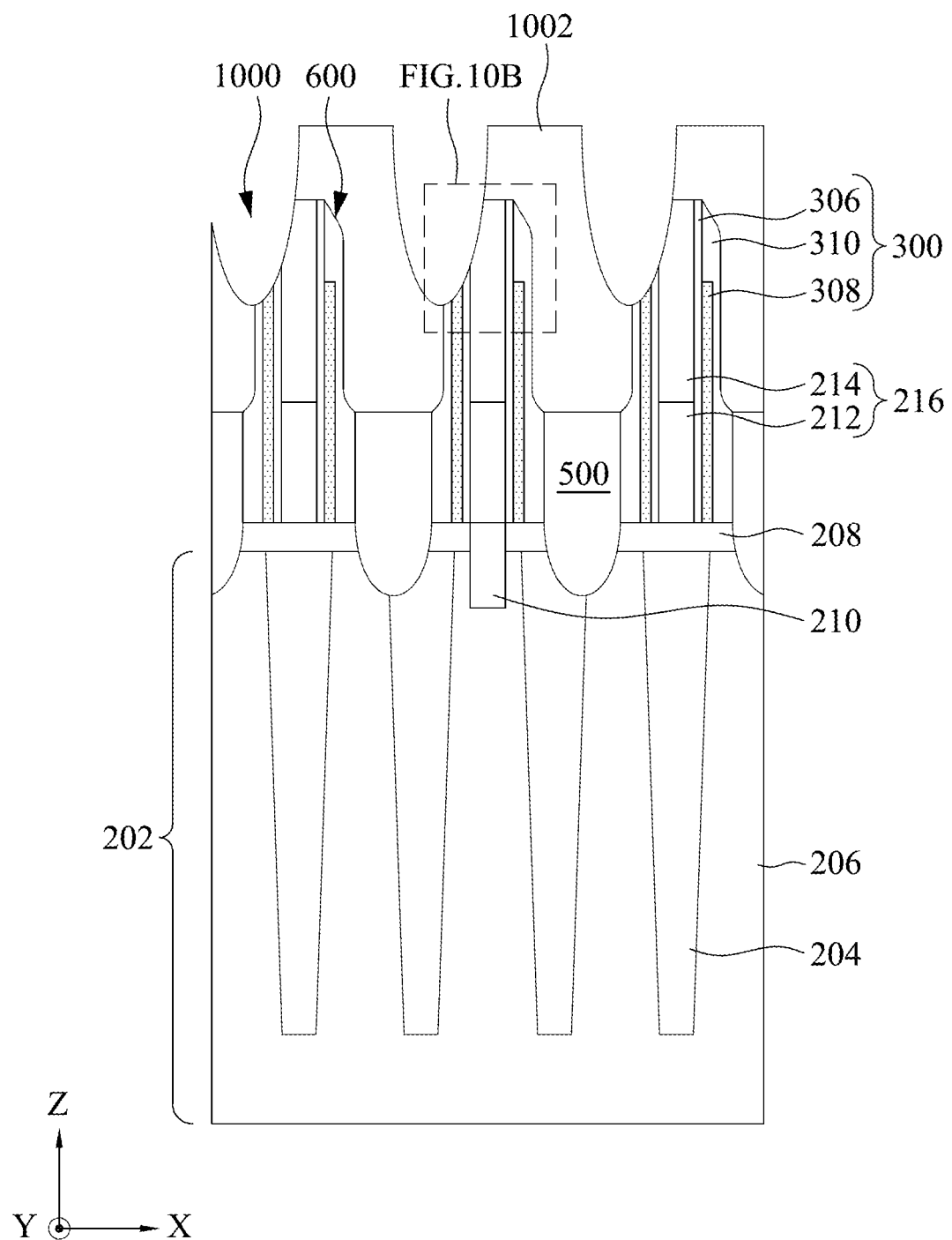

Referring to FIG. 10A, at least a portion of the landing pad material 902 (see FIG. 9) is removed to form a landing pad 1002. A mask pattern (not shown) may be formed on the landing pad material 902. Subsequently, the landing pad material 902 is etched through the mask pattern as an etch mask and the landing pad 1002 is formed. In some embodiments, a portion of the bit line structure 216 and the spacer structure 300 may be removed as well. After etching, the landing pad 1002 is formed and may be separated from each other by an opening 1000.

The landing pad 1002 is disposed on the bit line structure 216 covers the slope 600. The landing pad 1002 can be against the slope 600. Due to the slope 600 formed, the landing pad 1002 can include an enlarged landing area without a necking profile formed in proximity to the top of the bit line structure 216. With the enlarged landing area, resistance of the landing pad can be reduced, thereby increasing current passing through the landing pad 1002. Therefore, a performance of a semiconductor device can be enhanced.

Figure 10B:
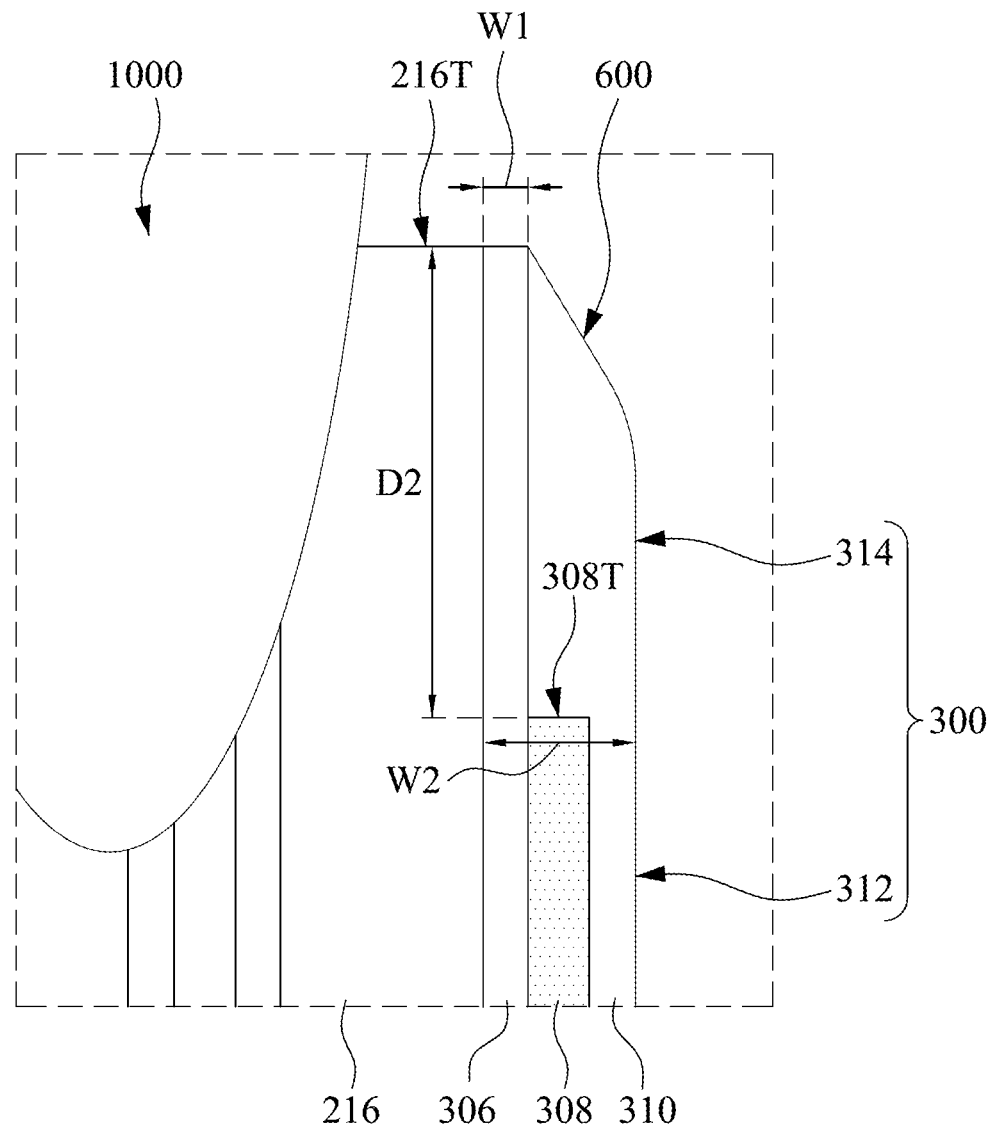
FIG. 10B is an enlarged view of a portion of a semiconductor device shown in FIG. 10A according to some embodiments of the present disclosure.

Referring to FIG. 10B, FIG. 10B is an enlarged view of a portion of a semiconductor device shown in FIG. 10A according to some embodiments of the present disclosure. The spacer structure 300 shown in FIG. 10B may include a first segment 314 above a top surface 308T of the second spacer layer 308 and a second segment 312 below the top surface 308T of the second spacer layer 308. The first segment 314 is close to a top of the spacer structure 300 with the slope 600, and the second segment 312 is beneath the first segment 314. Except exposed in the opening 1000, the second segment 312 can be capped with the first segment 314; in another words, a top of the second segment 312 can be covered by the first segment 314.

In some embodiments, the first segment 314 can include a 2-layer structure and the second segment 312 can include a 3-layer structure, respectively similar to the upper portion 304 and the lower portion 302 shown in FIG. 3.

Due to the slope 600, an overall width of the first segment 314 can be less than or equal to an overall width of the second segment 312. In another words, due to the slope 600, the overall width of the first segment 314 is gradually decreased from an interface with the second segment 312 to a top of the first segment 314.

In some embodiments, a ratio of a first width W1 of the top of the first segment 314 to a second width W2 of the top of the second segment 312 is in a range between about 20% and about 50%. If the ratio is greater than above-noted upper limits, no obvious advantage can be achieved. If the ratio is less than above-noted lower limits, the accuracy in fabrication process may be largely increased.

In some embodiments, a difference between the first width W1 and the second width W2 may be in the range between about 5 nm and about 8 nm. If the difference is greater than above-noted upper limits, the accuracy in fabrication process may be largely increased. If the difference is less than above-noted lower limits, no obvious advantage can be achieved.

In some embodiments, the first width W1 of the top of the first segment 314 may be between about 2 nm and about 5 nm. In some embodiments, the second width W2 of a top of the second segment 312 may be between about 10 nm.

The top of the second segment 312 (i.e., the top surface 308T of the second spacer layer 308) has a level less than the top surface 216T of the bit line structure 216 by a second distance D2. The second distance D2 can substantially be a vertical length (e.g., along the Z axis) of the first segment 314. The second distance D2 may be varied with a process design and product requirement. In some embodiments, the second distance D2 can be in a range of about 15 nm to about 35 nm. If the second distance D2 is greater than the above-noted upper limits, no significant benefit can be obtained. If the second distance D2 is less than the above-noted lower limits, the accuracy in fabrication process may be largely increased such as a formation of the opening 1000 may require a well control.

Figure 11:
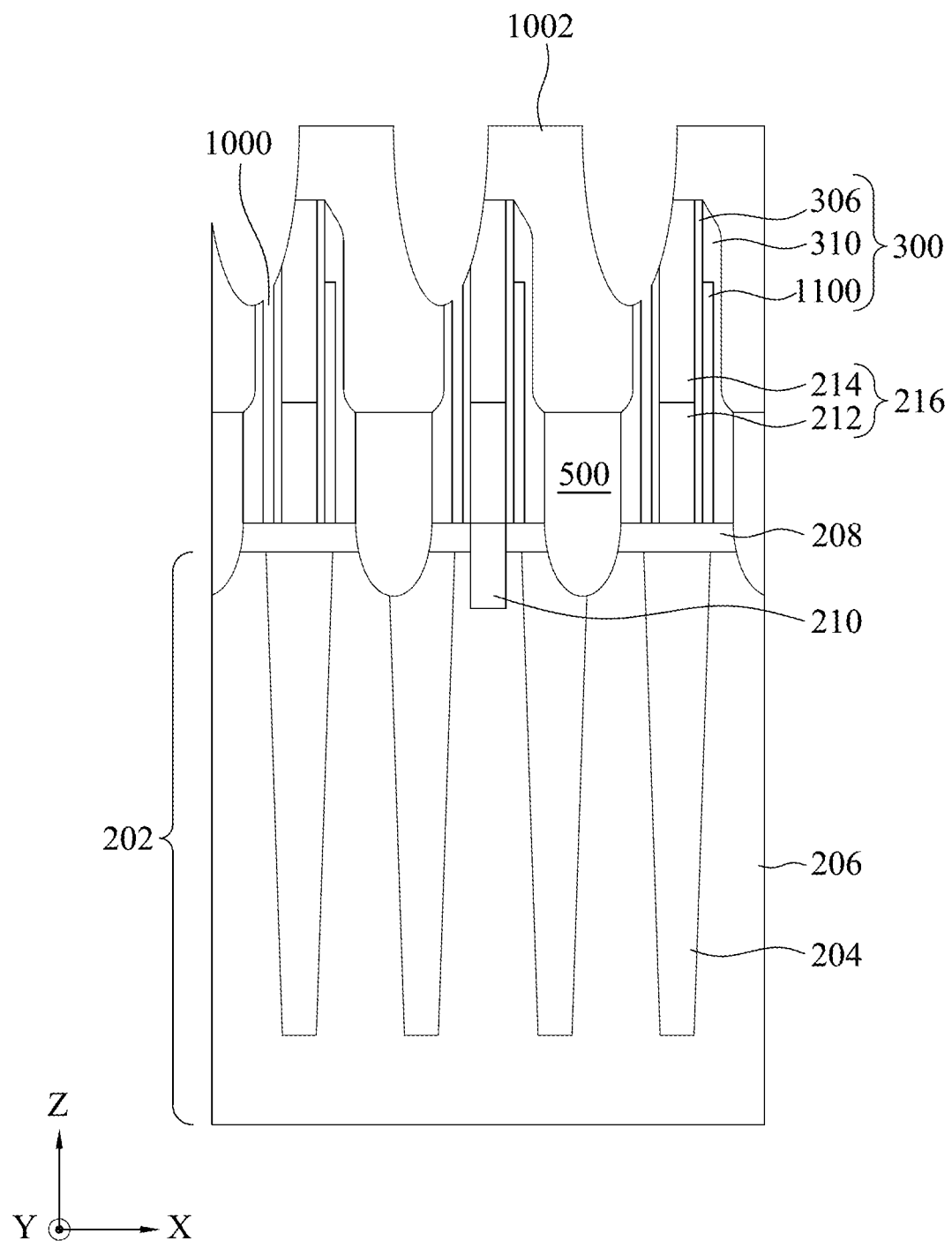
FIG. 11 and FIG. 12 are cross-sectional views illustrating different steps of a method of fabricating a semiconductor device according to some embodiments of the present disclosure.

Referring to FIG. 11, the second spacer layer 308 (see FIG. 10A) is selectively removed and consequently an air gap 1100 is formed. The air gap 1100 is formed between the first spacer layer 306 and the third spacer layer 310. Therefore, the spacer structure 300 can include "first spacer layer 306—air gap 1100—third spacer layer 310" between the first conductive layer 212 and contact plug 500. The air gap 1100 may keep having a dielectric constant of approximate 1 to reduce parasitic capacitance between the first conductive layer 212 and contact plug 500, thus increasing semiconductor performance.

The removal of the second spacer layer 308 (see FIG. 10A) may include a selective etching. The second spacer layer 308 which includes oxide has an etch selectivity with respect to the first spacer layer 306 and the third spacer layer 310. In other words, the etching rate on the second spacer layer 308 is higher than that on the first spacer layer 306 and the third spacer layer 310.

In some embodiments, a vapor etch process is applied for the second spacer layer 308. In some embodiments, the vapor etch process includes hydrogen fluoride.

Figure 12:
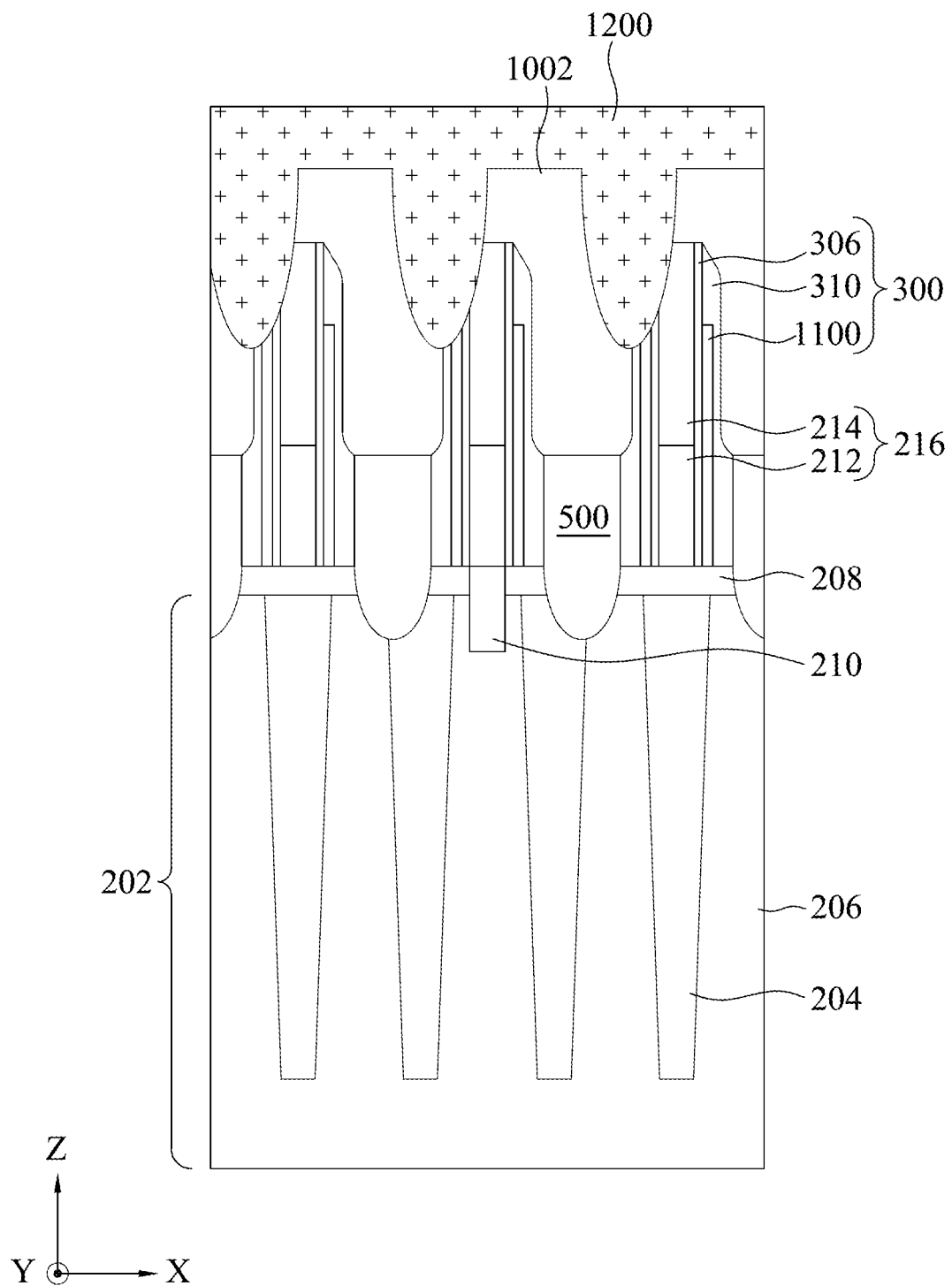

Referring to FIG. 12, the air gap 1100 is capped with an insulation layer 1200 overlying the landing pad 1002, the bit line structure 216 and/or the spacer structure 300. The insulation layer 1200 can be deposited by any suitable deposition processes such as CVD, ALD, and PVD. In some embodiments, the insulation layer 1200 may include silicon nitride. In some embodiments, the insulation layer 1200 may include a material substantially same as the first spacer layer 306 or the third spacer layer 310.

The above embodiments provide various advantages. With the above-mentioned method and configuration thereof, a spacer structure with a slope slanting to a bit line structure can help a landing pad to have an enlarged landing area, thereby decreasing resistance of the landing pad. Consequently, a performance of a semiconductor device can be enhanced. In addition, the method can also provide a way to protect an intact air gap during a formation of the slope.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A method of fabricating a semiconductor device, comprising:
   forming a bit line structure over a substrate;
   forming a spacer structure on a sidewall of the bit line structure;
   partially removing an upper portion of the spacer structure to form a slope on the spacer structure slanting to the bit line structure;
   forming a landing pad material to cover the spacer structure and contact the slope, comprising:
      forming a first conductive layer on the bit line structure and the spacer structure after forming the slope on the spacer structure slanting to the bit line structure;
      leveling the first conductive layer and the bit line structure with the slope at the same time after forming the first conductive layer; and
      forming a second conductive layer on the bit line structure and the leveled first conductive layer, wherein the first conductive layer and the second conductive layer is collectively regarded as the landing pad material; and
   removing at least a portion of the landing pad material to form a landing pad against the slope.

2. The method of fabricating the semiconductor device of claim 1, further comprising:
   forming a third conductive layer to cover the sidewall of the spacer structure; and
   electrically connecting the third conductive layer and the landing pad, wherein the landing pad is positioned above the third conductive layer.

3. The method of fabricating the semiconductor device of claim 2, further comprising removing a portion of the third conductive layer to expose the upper portion of the spacer structure before the partially removing the upper portion of the spacer structure.

4. The method of fabricating the semiconductor device of claim 3, wherein the removing the portion of the third conductive layer to expose the upper portion of the spacer structure and the partially removing the upper portion of the spacer structure are performed in a same processing tool.

5. The method of fabricating the semiconductor device of claim 1, wherein the partially removing the upper portion of the spacer structure comprises performing a dry etching on the upper portion of the spacer structure.

6. The method of fabricating the semiconductor device of claim 1, wherein the partially removing the upper portion of the spacer structure comprising rounding the bit line structure.

7. The method of fabricating the semiconductor device of claim 1, wherein a height of the bit line structure is greater than a height of the spacer structure after the partially removing the upper portion of the spacer structure.

* * * * *